(12) United States Patent
Lombard et al.

(10) Patent No.: US 8,797,793 B2
(45) Date of Patent: Aug. 5, 2014

(54) SELF-REFERENCED MRAM ELEMENT WITH LINEAR SENSING SIGNAL

(71) Applicant: Crocus Technology SA, Grenoble Cedex (FR)

(72) Inventors: Lucien Lombard, Grenoble (FR); Kenneth MacKay, Le Sappey en Chartreuse (FR); Ioan Lucian Prejbeanu, Seyssinet Pariset (FR)

(73) Assignee: Crocus Technology SA, Grenoble Cedex (FR)

( * ) Notice: Subject to any disclaimer, the term of this patent is extended or adjusted under 35 U.S.C. 154(b) by 0 days.

(21) Appl. No.: 13/761,292

(22) Filed: Feb. 7, 2013

(65) Prior Publication Data

US 2013/0201756 A1    Aug. 8, 2013

(30) Foreign Application Priority Data

Feb. 8, 2012    (EP) ..................................... 12290043

(51) Int. Cl.
     *G11C 11/15*    (2006.01)
(52) U.S. Cl.
     USPC ............ 365/173; 365/171; 365/158; 365/227
(58) Field of Classification Search
     USPC ........... 365/158, 173, 171, 225.5, 243.5, 227, 365/226
     See application file for complete search history.

(56) References Cited

U.S. PATENT DOCUMENTS

| 8,045,366 | B2 * | 10/2011 | Zheng et al. | ................. | 365/158 |
| 8,422,279 | B2 * | 4/2013 | Zheng et al. | ................. | 365/158 |
| 8,576,617 | B2 * | 11/2013 | Zhu et al. | ..................... | 365/158 |
| 2009/0190390 | A1 | 7/2009 | Wecker et al. | | |
| 2011/0006385 | A1 | 1/2011 | Zheng et al. | | |

FOREIGN PATENT DOCUMENTS

DE            10149737 A1    4/2003

OTHER PUBLICATIONS

Search Report for EP12290043 dated Jul. 18, 2012.

* cited by examiner

*Primary Examiner* — Andrew Q Tran
(74) *Attorney, Agent, or Firm* — Pearne & Gordon LLP

(57) ABSTRACT

The present disclosure concerns a self-referenced MRAM element, comprising a magnetic tunnel junction having a magnetoresistance, comprising: a storage layer having a storage magnetization that is pinned along a first direction when the magnetic tunnel junction is at a low temperature threshold; a sense layer having a sense magnetization; and a tunnel barrier layer included between the storage layer and the sense layer; and an aligning device arranged for providing the sense magnetization with a magnetic anisotropy along a second direction that is substantially perpendicular to the first direction such that the sense magnetization is adjusted about the second direction; the aligning device being further arranged such that, when a first read magnetic field is provided, a resistance variation range of the magnetic tunnel junction is at least about 20% of the magnetoresistance. The self-referenced MRAM cell can be read with an increased reliability and has reducing power consumption.

8 Claims, 4 Drawing Sheets

(a) (b) (c)

SELF-REFERENCED MRAM ELEMENT WITH LINEAR SENSING SIGNAL

FIELD

The present invention concerns a self-referenced magnetic random access memory (MRAM) cell using linear sensing signal to ensure low reading magnetic field.

BACKGROUND

Magnetic random access memory (MRAM) cells using the so-called self-referenced reading operation typically comprise a magnetic tunnel junction formed of a magnetic storage layer having a magnetization which direction can be changed from a first stable direction to a second stable direction, a thin insulating layer, and a sense layer having a reversible direction. Self-referenced MRAM cells allows for performing the write and read operation with low power consumption and an increased speed.

However, during the read operation a dipolar coupling between the storage and sense layers occurs due to local magnetic stray field, coupling the magnetization of the sense layer with the one of the storage layer in a closed magnetic flux configuration. Switching the sense layer magnetization during the read operation will then require applying a magnetic field high enough to overcome the dipolar coupling. The dipolar coupling results in a shift (or bias) of the hysteresis loop when applying a field cycle to measure the hysteresis loop of the sense layer. This dipolar coupling depends on the thickness and magnetization of the storage and sense layers, and on the size of the magnetic tunnel junction. In particular, dipolar coupling increases with decreasing the magnetic tunnel junction diameter and can thus become a major issue when scaling down the MRAM cell.

US20090190390 concerns an MRAM cell comprising a first magnetic layer structure having a first magnetization along a first axis; a second magnetic layer structure, and a non-magnetic spacer layer between the first and second magnetic layer structure. The second magnetic layer structure has a second magnetization along a second axis that is arranged at an angle with regard to the first axis such that, by changing the direction of the second magnetization, the direction of the first magnetization along the first axis can be determined.

SUMMARY

The present disclosure concerns a MRAM element, comprising a magnetic tunnel junction having a junction resistance comprising a storage layer having a storage magnetization that is pinned along a first direction when the magnetic tunnel junction is at a low temperature threshold, a sense layer having a sense magnetization, and a tunnel barrier layer included between the storage layer and the sense layer; the magnetic tunnel junction having a magnetoresistance corresponding to the difference between a high junction resistance value where the sense magnetization is antiparallel to the storage magnetization, and a low junction resistance value where the sense magnetization is parallel to the storage magnetization; the MRAM element further comprising an aligning device arranged for providing the sense magnetization with a magnetic anisotropy along a second direction that is substantially perpendicular to the first direction; and a first current line for providing a first read magnetic field adapted to adjust the sense magnetization about the second direction such as to vary the junction resistance within a range being at least about 20% than the magnetoresistance; said aligning device being further arranged such that the junction resistance varies linearly within said range.

In an embodiment, said aligning device can comprise a second antiferromagnetic layer exchange coupling the sense layer such as to pin the sense magnetization along the second direction when the magnetic tunnel junction is at the low temperature threshold and in the absence of the first read magnetic field.

In another embodiment, the exchange coupling between the second antiferromagnetic layer and the sense layer can be such that the sense magnetization is adjustable about the second direction when the magnetic tunnel junction is at the low temperature threshold and when applying the first read magnetic field.

In yet another embodiment, the exchange coupling between the second antiferromagnetic layer and the sense layer shifts the resistance response curve such that the junction resistance varies linearly within said range.

In yet another embodiment, said aligning device can comprise a second current line substantially orthogonal with the first field line and adapted for applying a second field current such as to saturate the sense magnetization along the second direction.

In yet another embodiment, the MRAM element can further comprise a first antiferromagnetic layer exchange coupling the storage layer such as to pin the storage magnetization along a first direction when the magnetic tunnel junction is at a low temperature threshold and when applying the first read magnetic field.

The present disclosure also pertains to a method for reading the MRAM element, comprising:
  adjusting the sense magnetization in a first read direction;
  measuring a first junction resistance value;
  adjusting the sense magnetization in a second read direction; and
  measuring a second junction resistance value;
wherein said adjusting the sense magnetization is performed about the second direction within a range being at least about 20% than the magnetoresistance; and wherein the junction resistance varies linearly within said range.

The self-referenced MRAM cell disclosed herein can be read with an increased reliability when using a low reading magnetic field, and has reducing power consumption compared with conventional self-referenced MRAM cells, even in the presence of a strong dipolar offset.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
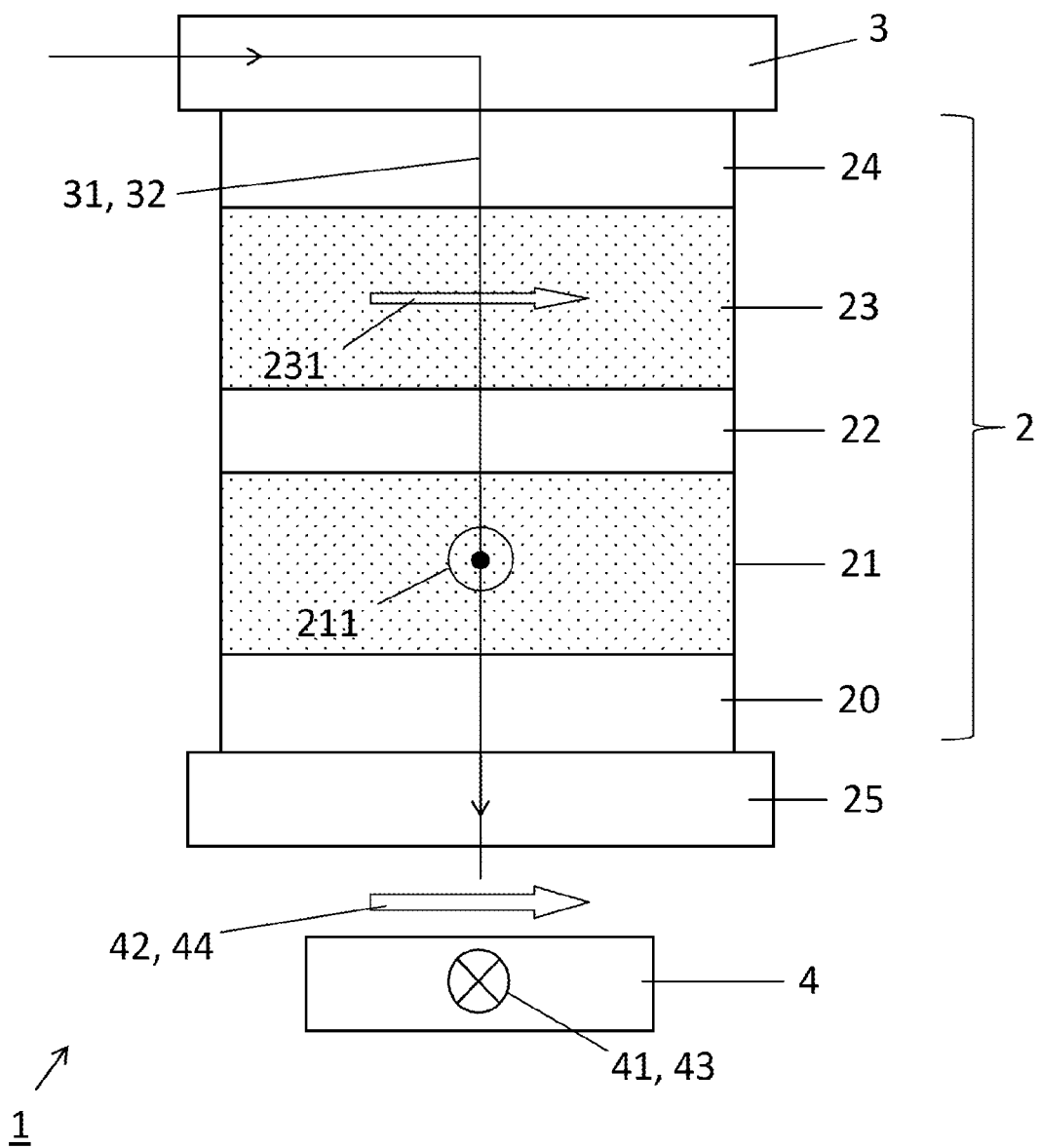
FIG. 1 illustrates a magnetic random access memory (MRAM) element comprising a storage layer and a sense layer, according to an embodiment.
Figure 2:
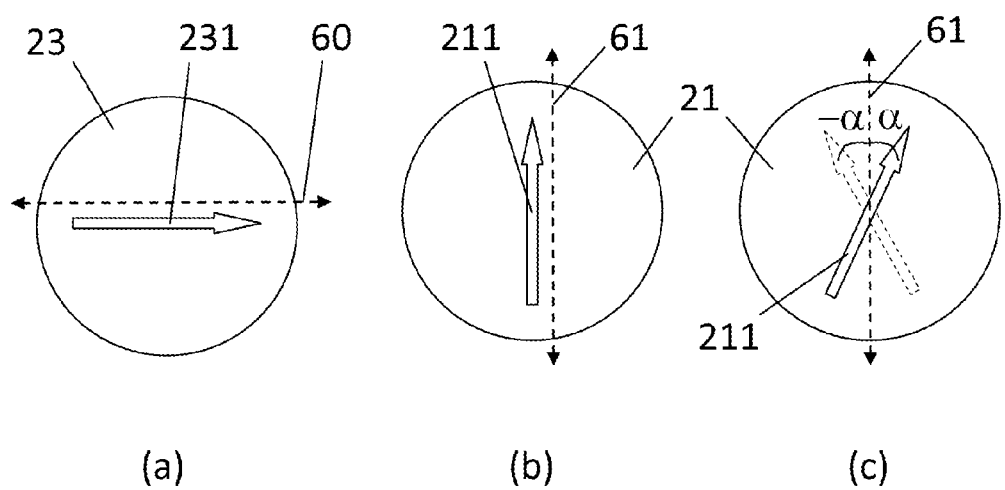
FIG. 2 represents a top view of the storage layer (FIG. 2a) and of the sense layer (FIGS. 2b and 2c) illustrating the arrangement of the storage magnetization and of the sense magnetization, according to an embodiment.

FIG. 1 illustrates a self-referenced random access memory (MRAM) element 1 according to an embodiment. The MRAM element 1 comprises a magnetic tunnel junction 2 comprising a storage layer 23 having a storage magnetization 231; a sense layer 21 having a sense magnetization 211; and a tunnel barrier layer 22 between the storage layer 23 and the sense layer 21. FIG. 2 represents a top view of the storage layer 23 (FIG. 2a) and of the sense layer 21 (FIG. 2b) of the MRAM element 1, illustrating arrangements of the storage and sense magnetizations 231, 211, respectively. The magnetic tunnel junction 2 further comprises a first antiferromagnetic layer 24 having a first critical temperature $T_{C1}$ and exchange coupling the storage layer 23 such that, at a low temperature threshold below the first critical temperature $T_{C1}$, the storage magnetization 231 is pinned along a first direction 60 at the low temperature threshold and is no more pinned at a high temperature threshold, at and above the first critical temperature $T_{C1}$.

According to an embodiment, a thermally-assisted (TA) write operation of the MRAM element 1 can comprise:
  heating the magnetic tunnel junction 2 to the high temperature threshold;
  adjusting the storage magnetization 231; and
  cooling the magnetic tunnel junction 2 to the low temperature threshold.

Heating the magnetic tunnel junction 2 can be performed by passing a heating current 31 in the magnetic tunnel junction 2, via a first current line 3 in electrical contact with the magnetic tunnel junction 2. Adjusting the orientation of the storage magnetization 231 can be performed by applying an external write magnetic field 42 adapted to switch the storage magnetization 231 along the first direction 60. In the example of FIG. 1, the MRAM element 1 further comprises a first field line 4 in communication with the magnetic tunnel junction 2. The first field line 4 is adapted for passing a write current 41 such as to generate the write magnetic field 42. The first field line 4 and the write current 41 are represented entering the page such that the write magnetic field 42 can switch the storage magnetization 231 from an initial orientation toward the left (not shown) to a written orientation toward the right. Alternatively, the write magnetic field 42 can also be generated by passing the field current 41 in a current line 3. Once the magnetic tunnel junction 2 has been cooled to the low temperature threshold, the storage magnetization 231 becomes pinned in the adjusted, or written, orientation in accordance with the orientation of the write magnetic field 42.

A method for reading the MRAM element 1 using a self-referenced read operation can comprise:
  adjusting the sense magnetization 211 in a first read direction;
  measuring a first junction resistance value $R_1$;
  adjusting the sense magnetization 211 in a second read direction; and
  measuring a second junction resistance value $R_2$.

Adjusting the sense magnetization 211 in a first read direction can comprise applying a first read magnetic field 44 having a first polarity by passing a first read current 43 with a first polarity in the first field line 4. Adjusting the sense magnetization 211 in a second read direction can comprise applying the first read magnetic field 44 having a second polarity, opposed to the first polarity, by passing the first read current 43 with a second polarity, opposed to the first polarity, in the first field line 4. The first read magnetic field 44 is applied at a read temperature that is below the first critical temperature, for example that can correspond to the low temperature threshold, where the storage magnetization 231 is being pinned by the first antiferromagnetic layer 24. Measuring the first and second junction resistance values $R_1$, $R_2$ can be performed by passing a sense current 32 in the magnetic tunnel junction 2 via the current line 3.

In an embodiment represented in FIGS. 1 and 2, the magnetic tunnel junction 2 further comprises second antiferromagnetic layer 20 having a second critical temperature $T_{C2}$ being higher than the first critical temperature $T_{C1}$. The second antiferromagnetic layer 20 exchange couple the sense layer 21 such that, below the second critical temperature $T_{C2}$ or at the low temperature threshold, the sense magnetization 211 has a magnetic anisotropy, or exchange anisotropy, along a second direction 61 that is substantially perpendicular to the first direction 60. More particularly, below the second critical temperature $T_{C2}$ of the tunnel magnetic junction 2 (at the low temperature threshold) and in the absence of the first read magnetic field 44, the sense magnetization 211 is pinned along the second direction 61. The sense magnetization 211 is no more pinned at and above the second critical temperature $T_{C2}$, or at the high temperature threshold. FIGS. 2a and 2b illustrate, respectively, a "top view" the storage magnetization 231 oriented along the first direction 60 and the sense magnetization 211 oriented along the second direction 61, perpendicular to the first direction 60. In the example of FIG. 1, the storage magnetization 231 is shown oriented towards the right and the sense magnetization 211 is shown oriented exiting the page. Pinning the magnetization 211 in the second direction 61 by the second antiferromagnetic layer 20 can be obtained by magnetic annealing the second antiferromagnetic layer 20 during the fabrication process of the MRAM element 1, after depositing the second sense layer 21.

The second antiferromagnetic layer 20 is further arranged such that, when applying the first read magnetic field 44 at the low temperature threshold, the sense magnetization 211 can be adjusted about the second direction 61 while the storage magnetization 231 remains aligned substantially parallel to the first direction 60. This is illustrated in FIG. 2c where the sense magnetization 211 is adjusted by an angle α or −α around the second direction 61 depending on the read direction of the first read magnetic field 44. The adjustment angle α increases with increasing the applied first read magnetic field 44. The exchange coupling between the antiferromagnetic layer 24 and the storage layer 23 should be such that the storage magnetization 231 remains pinned in the first direction 60 in the presence of the first read magnetic field 44.

The second antiferromagnetic layer 20 being made from a material comprising a manganese-based alloy, such as PtMn, or any other suitable materials. The first antiferromagnetic layer 24 can be made from a material comprising a manganese-based alloy, such as IrMn or FeMn, or any other suitable materials.

Figure 3:
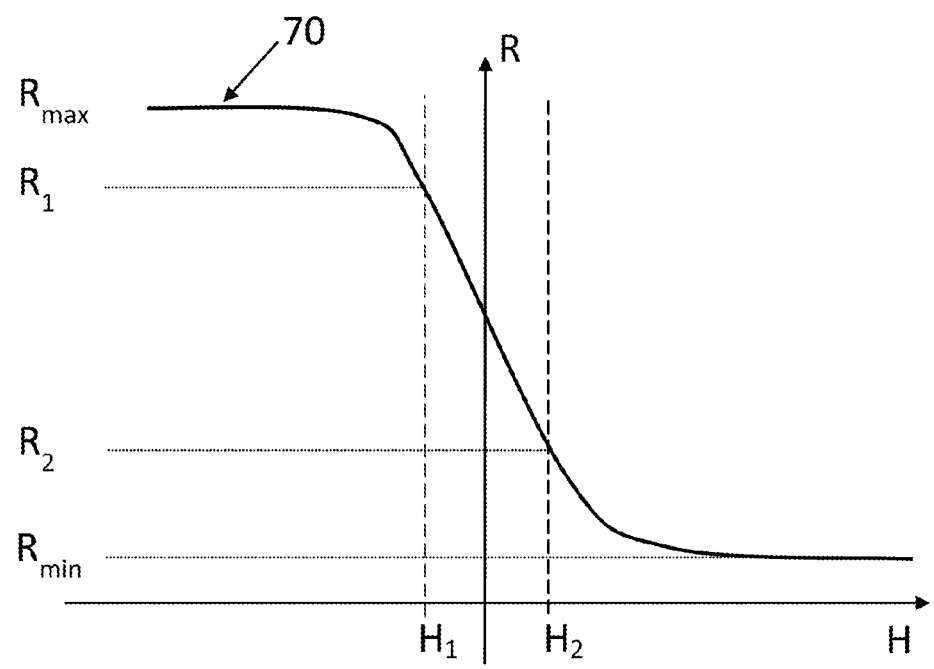
FIG. 3 illustrates a resistance response curve of the magnetic tunnel junction, according to an embodiment.

FIG. 3 illustrates a resistance response curve 70 of the magnetic tunnel junction 2 where the the sense magnetization 211 is being adjusted about the second direction 61 substantially perpendicular to the first direction 60 of the storage magnetization 231. More particularly, FIG. 3 plots the junction resistance R of the magnetic tunnel junction 2 as a function of the magnetic field strength H of the first read magnetic field 44. The junction resistance R varies from a high junction resistance value $R_{max}$ when the sense magnetization 211 is adjusted in a direction substantially antiparallel to the storage magnetization 231 (α about −90°), to a low junction resistance value $R_{min}$ when the sense magnetization 211 is adjusted in a direction substantially parallel to the storage magnetization 231 (α about 90°). The high and low junction resistance values $R_{max}$, $R_{min}$ are obtained by applying the first read magnetic field 44 with a high magnetic field strength H in the first and second polarity, respectively.

A magnetoresistance MR of the magnetic tunnel junction 2 can be defined by the difference between the high junction resistance value $R_{max}$ and the low junction resistance value $R_{min}$:

$$MR = R_{max} - R_{min} \quad \text{(Equation 1).}$$

For intermediate magnetic field strength H values of the first read magnetic field 44, the junction resistance R has intermediate value comprised between the high and low junction resistance values $R_{max}$, $R_{min}$, corresponding to the sense magnetization 211 being adjusted at intermediate orientations between the parallel and antiparallel directions ($-90°<\alpha<90°$). In FIG. 3, this is represented by the first and second junction resistance values $R_1$ and $R_2$, being measured when the first read magnetic field 44 is applied with a field strength value $H_1$, $H_2$ having a first polarity $H_1$ and a second polarity $H_2$. Preferably, the first read magnetic field 44 is such that the first and second junction resistance values $R_1$, $R_2$ are comprised in the linear portion of the resistance response curve 70, as illustrated in FIG. 3. In other words, during the read operation, the first read magnetic field 44 is applied such that the junction resistance R is varied within a variation range VR of:

$$VR = R_2 - R_1 \quad \text{(Equation 2).}$$

The variation range VR should be large such as to increase the reliability of the read operation. Preferably, the variation range VR should be at least about 20% of the magnetoresistance MR of the magnetic tunnel junction 2. The first read magnetic field 44 can also be applied in an oscillating manner, i.e., swept from the first to the second polarity by passing the first read current 43 having an alternating polarity. The sense magnetization 211 is thus fluctuated around the second direction 61. This latter alternative can result in an increase speed in the read operation.

An advantage of the MRAM element 1 disclosed above is that, during the read operation, the sense magnetization 211 can be adjusted by applying the first read magnetic field 44 with a small field strength. The sense magnetization 211 is then adjusted with small angle $\alpha$ around the second direction 61 and the junction resistance R can be varied linearly (linear sensing signal). Another advantage is that applying the first read magnetic field 44 with small field strength allows for reducing power consumption of the MRAM element 1. Design and manufacturing control of the MRAM element 1 can therefore be simplified. Further, the amount of power dissipated by the MRAM element 1 during the read operation can be reduced.

Both storage layer 23 and sense layer 21 tend to exhibit magnetic stray fields (not shown) which couple each other such as to favor antiparallel alignment of sense magnetization 211 with respect to storage magnetization 231. This is called dipolar coupling. The magnitude of the magnetic stray fields originating from the sense layer 21 and storage layer 23 depends on the diameter of the magnetic tunnel junction 2 and increase when the diameter is decreased. With the storage layer 23 being pinned by the antiferromagnetic layer 24 along the anisotropy direction 60, the dipolar coupling results in a shift of the magnetoresistive linear sensing signal of the magnetic tunnel junction. The magnitude of the shift of the magnetoresistive linear sensing signal increases when the diameter of the magnetic tunnel junction is decreased. The dipolar coupling can therefore become a major issue when scaling down the MRAM element 1.

Figure 4:
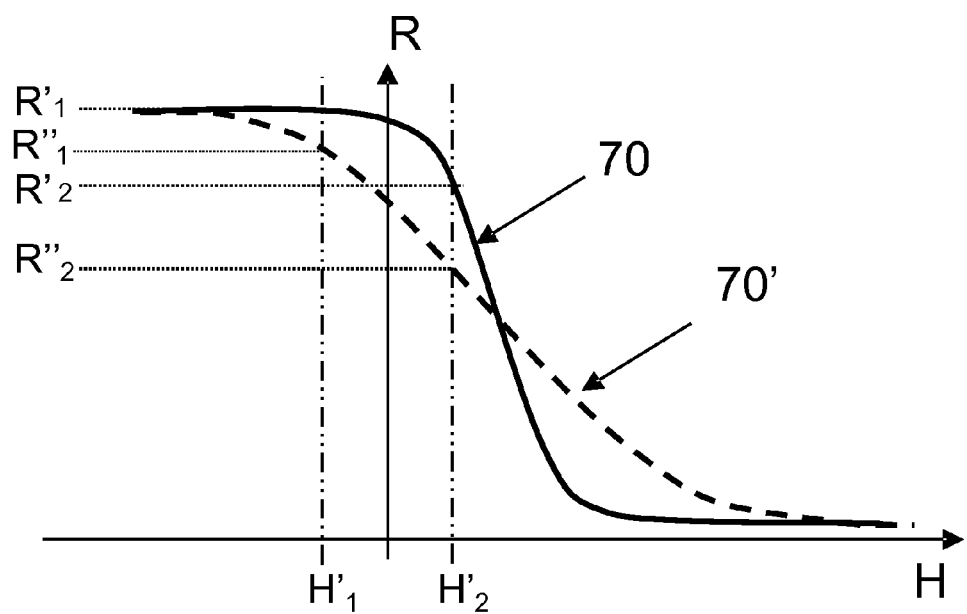
FIG. 4 illustrates the resistance response curve of the magnetic tunnel junction, according to another embodiment.

The effect of the dipolar coupling shift is illustrated in FIG. 4 by the first and second field strength value $H'_1$, $H'_2$ being offset toward the left of the resistance response curve 70 compared to the first and second field strength value $H_1$, $H_2$ shown in FIG. 3, in the absence of stray field. As shown in FIG. 4, the offset values $H'_1$, $H'_2$ of the first read magnetic field 44 can be such that the difference between the first and second resistance values $R'_1$, $R'_2$ is small such that the variation range VR becomes smaller than 20% of the magnetoresistance MR. In the case of a very large stray field, the offset values $H'_1$, $H'_2$ of the first read magnetic field 44 could even be shifted completely on the plateau of the resistance response curve 70 yielding a variation range VR essentially null.

On the other hand, an exchange bias from the exchange coupling between the second antiferromagnetic layer 20 and the sense layer 21 increases the saturation field of the sense layer 21. FIG. 4 compares the resistance response curve 70 of FIG. 3 with a resistance response curve 70' with increased saturation field of sense layer 21. The resistance response curve 70' has a smaller slope and the difference between the first resistance $R''_1$ and the second values $R''_2$ obtained when applying the first read magnetic field 44 with the offset values $H'_1$, $H'_2$ results in variation range VR being larger.

In an embodiment, the second antiferromagnetic layer 20 is arranged such that the exchange coupling between the second antiferromagnetic layer 20 and the sense layer 21 shifts the resistance response curve 70' such that the variation range VR is at least about 20% of the magnetoresistance MR when applying the first read magnetic field 44. A stronger exchange coupling between the second antiferromagnetic layer 20 and the sense layer 21, or larger exchange bias, can be obtained by optimizing the properties of the antiferromagnetic layer 20.

Figure 5:
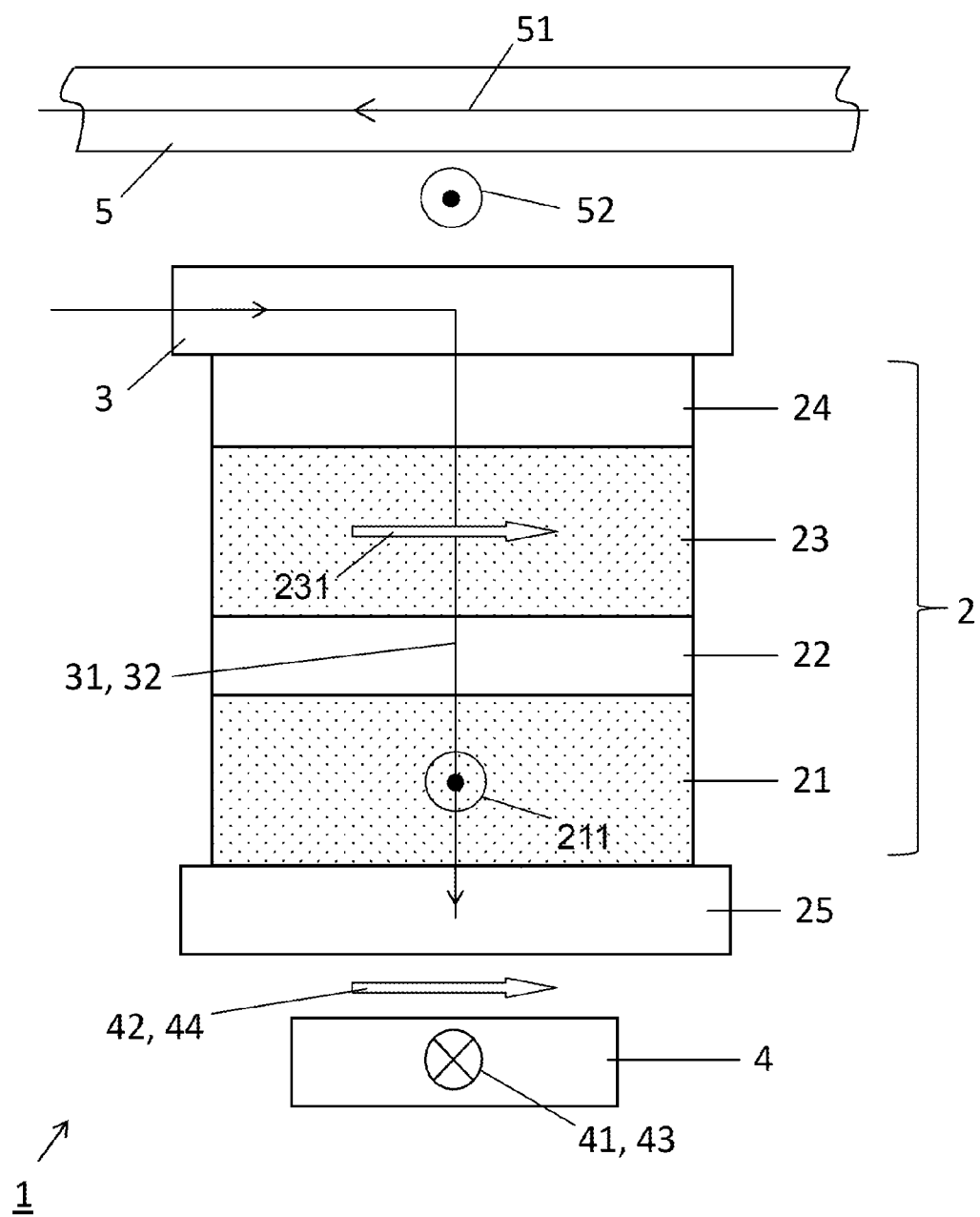
FIG. 5 represents the MRAM element according to an embodiment.

In yet another embodiment represented in FIG. 5, the MRAM element 1 further comprises a second field line 5 in communication with the magnetic tunnel junction 2. The second field line 5 is adapted for passing a second read current 51 such as to generate a second read magnetic field 52. In the example of FIG. 5, the second current line 5 is substantially orthogonal with the first field line 4, in communication with the opposed end of the magnetic tunnel junction 2. Other placements of the second field line 5 are however also possible. For example, the second field line 5 could be disposed on at the same end of the magnetic tunnel junction 2 than the first field line 4. The second read magnetic field 52 is adapted for providing the second magnetic anisotropy along the second direction 61 being substantially perpendicular to the first direction 60. More particularly, the second read magnetic field 52 is such as to saturate the sense magnetization 211 in the second direction 61 being substantially perpendicular to the first direction 60. In the example of FIG. 5, the second read magnetic field 52 is shown exiting the page, thus perpendicular to the direction of the storage magnetization 231 being substantially parallel to the first direction 60.

According to the embodiment, the read operation further comprises a step of applying the second read magnetic field 52 such as to saturate the sense magnetization 211 in the second direction 61 being substantially perpendicular to the first direction 60. Adjusting the sense magnetization 211 in the first and second read directions can comprise applying the first read magnetic field 44 in the first and second, respectively. Here, the first read magnetic field 44 is applied simultaneously with the second read magnetic field 52 such that the sense magnetization 211 is adjusted by the first read magnetic field 44 about the second direction 61 set by the second read magnetic field 52.

REFERENCE NUMBERS 1 magnetic random access memory cell
2 magnetic tunnel junction 20 second antiferromagnetic layer
21 sense layer
211 sense magnetization
22 tunnel barrier layer
23 synthetic storage layer
231 first ferromagnetic layer
232 second ferromagnetic layer
24 first antiferromagnetic layer
3 current line
31 heating current
4 first field line
41 write current
42 write magnetic field
43 first read current
44 first read magnetic field
5 second field line
51 second read current
52 second read magnetic field
60 first direction
61 second direction
70 resistance response curve
71 resistance response curve with lower slope
H magnetic field strength
R resistance
$R_1$ first resistance
$R_2$ second resistance
$R_{1/2}$ zero field resistance
$R_{max}$ high resistance
$R_{min}$ low resistance
$T_{C1}$ first critical temperature
$T_{C2}$ second critical temperature
MR magneto resistance
VR variation range

The invention claimed is:

1. Self-referenced magnetic random access memory (MRAM) element, comprising:
    a magnetic tunnel junction having a junction resistance comprising:
        a storage layer having a storage magnetization that is pinned along a first direction when the magnetic tunnel junction is at a low temperature threshold;
        a sense layer having a sense magnetization; and
        a tunnel barrier layer included between the storage layer and the sense layer;
        the magnetic tunnel junction having a magnetoresistance corresponding to the difference between a high junction resistance value where the sense magnetization is antiparallel to the storage magnetization, and a low junction resistance value where the sense magnetization is parallel to the storage magnetization;
    the MRAM element further comprising:
    an aligning device arranged for providing the sense magnetization with a magnetic anisotropy along a second direction that is substantially perpendicular to the first direction; and
    a first field line for providing a first read magnetic field adapted to adjust the sense magnetization about the second direction such as to vary the junction resistance within a range being at least about 20% of the magnetoresistance;
    said aligning device being further arranged such that the junction resistance varies linearly within said range.

2. MRAM element according to claim 1, wherein said aligning device comprises a second antiferromagnetic layer exchange coupling the sense layer such as to pin the sense magnetization along the second direction when the magnetic tunnel junction is at the low temperature threshold and in the absence of the first read magnetic field.

3. MRAM element according to claim 2, wherein the exchange coupling between the second antiferromagnetic layer and the sense layer is such that the sense magnetization is adjustable about the second direction when the magnetic tunnel junction is at the low temperature threshold and when applying the first read magnetic field.

4. MRAM element according to claim 2, wherein the exchange coupling between the second antiferromagnetic layer and the sense layer shifts a resistance response curve such that the junction resistance varies linearly within said range.

5. MRAM element according to claim 1, wherein said aligning device comprises a second field line substantially orthogonal to the first field line and adapted for applying a second read magnetic field such as to saturate the sense magnetization along the second direction.

6. MRAM element according to claim 1, further comprising
    a first antiferromagnetic layer exchange coupling the storage layer such as to pin the storage magnetization along the first direction when the magnetic tunnel junction is at the low temperature threshold and when applying the first read magnetic field.

7. A method for reading an MRAM element, comprising:
    a magnetic tunnel junction comprising a storage layer having a storage magnetization that is pinned along a first direction when the magnetic tunnel junction is at a low temperature threshold, a sense layer having a sense magnetization, and a tunnel barrier layer included between the storage layer and the sense layer, the magnetic tunnel junction having a magnetoresistance corresponding to the difference between a high junction resistance value where the sense magnetization is antiparallel to the storage magnetization and a low junction resistance value where the sense magnetization is parallel to the storage magnetization;
    an aligning device arranged for providing the sense magnetization with a magnetic anisotropy along a second direction that is substantially perpendicular to the first direction; and
    a first field line for providing a first read magnetic field;
    the method comprising:
        adjusting the sense magnetization in a first read direction;
        measuring a first junction resistance value;
        adjusting the sense magnetization in a second read direction; and
        measuring a second junction resistance value;
        wherein said adjusting the sense magnetization is performed about the second direction within a range being at least about 20% of the magnetoresistance; and wherein
        the junction resistance varies linearly within said range.

8. Method according to claim 7, wherein
said adjusting the sense magnetization comprise applying the first read magnetic field by passing a first read current in the first field line.

* * * * *